US008216769B2

(12) United States Patent
Andriessen et al.

(10) Patent No.: US 8,216,769 B2
(45) **Date of Patent: *Jul. 10, 2012**

(54) NEGATIVE WORKING, HEAT SENSITIVE LITHOGRAPHIC PRINTING PLATE PRECURSOR

(75) Inventors: Hieronymus Andriessen, Beerse (BE); Steven Lezy, Antwerp (BE); Hubertus Van Aert, Pulderbos (BE); Joan Vermeersch, Deinze (BE)

(73) Assignee: Agfa Graphics NV, Mortsel (BE)

( * ) Notice: Subject to any disclaimer, the term of this patent is extended or adjusted under 35 U.S.C. 154(b) by 811 days.

This patent is subject to a terminal disclaimer.

(21) Appl. No.: 12/300,805

(22) PCT Filed: May 22, 2007

(86) PCT No.: PCT/EP2007/054950

§ 371 (c)(1),
(2), (4) Date: Nov. 14, 2008

(87) PCT Pub. No.: WO2007/135151

PCT Pub. Date: Nov. 29, 2007

(65) Prior Publication Data

US 2009/0258314 A1 Oct. 15, 2009

Related U.S. Application Data

(60) Provisional application No. 60/804,188, filed on Jun. 8, 2006.

(30) Foreign Application Priority Data

May 24, 2006 (EP) .................................... 06114473

(51) Int. Cl.
*G03F 7/09* (2006.01)
*G03F 7/26* (2006.01)
*B41N 1/08* (2006.01)

(52) U.S. Cl. ..................... 430/271.1; 430/302; 430/944; 101/450.1; 101/453

(58) Field of Classification Search ............... 430/270.1, 430/271.1, 300, 302, 944; 101/450.1, 453
See application file for complete search history.

(56) References Cited

U.S. PATENT DOCUMENTS

| | | | | |
|---|---|---|---|---|
| 2005/0084797 | A1 * | 4/2005 | Vermeersch et al. | 430/270.1 |
| 2009/0095184 | A1 * | 4/2009 | Vermeersch et al. | 101/463.1 |
| 2009/0155722 | A1 * | 6/2009 | Andriessen et al. | 430/302 |

FOREIGN PATENT DOCUMENTS

| | | | |
|---|---|---|---|
| EP | 0 625 728 | A2 | 11/1994 |
| EP | 0 770 494 | A2 | 5/1997 |
| EP | 0 770 495 | A1 | 5/1997 |
| EP | 0 770 496 | A1 | 5/1997 |
| EP | 0 770 497 | A1 | 5/1997 |
| EP | 0 823 327 | A2 | 2/1998 |
| EP | 0 849 091 | A1 | 6/1998 |
| EP | 0 864 420 | A1 | 9/1998 |
| EP | 0 894 622 | A2 | 2/1999 |
| EP | 0 901 902 | A2 | 3/1999 |
| EP | 1 342 568 | A1 | 9/2003 |
| EP | 1 564 020 | A1 | 8/2005 |
| EP | 1 614 538 | A2 | 1/2006 |
| EP | 1 614 539 | A1 | 1/2006 |
| EP | 1 614 540 | A1 | 1/2006 |
| EP | 1 834 764 | A1 | 9/2007 |
| JP | 2000-035663 | * | 2/2000 |
| WO | 97/39894 | A1 | 10/1997 |
| WO | 2006/037716 | A1 | 4/2006 |

OTHER PUBLICATIONS

Machine translation of JP 2000-035663, published on Feb. 2, 2000.*
"Material Safety Data Sheet—SAN", Polymer Technology& Services, LLC, Jun. 1, 2003.*
Official Communication issued in International Patent Application No. PCT/EP2007/054950, mailed on Aug. 2, 2007.
Andriessen et al.; "Method for Making a Lithographic Printing Plate"; U.S. Appl. No. 12/300,801, filed Nov. 14, 2008.

* cited by examiner

*Primary Examiner* — Anca Eoff
(74) *Attorney, Agent, or Firm* — Keating & Bennett, LLP

(57) ABSTRACT

A heat-sensitive negative-working lithographic printing plate precursor includes a support having a hydrophilic surface or which is provided with a hydrophilic layer and a coating provided thereon, the coating including an image-recording layer which includes hydrophobic thermoplastic polymer particles, a binder, and an infrared absorbing dye; wherein the hydrophobic thermoplastic polymer particles have an average particle diameter, measured by Photon Correlation Spectroscopy, of more than 10 nm and less than 40 nm; the amount of the IR-dye, without taking into account an optional counter ion, is more than 0.80 mg per m2 of the total surface of the thermoplastic polymer particles, measured by Hydrodynamic Fractionation; and the amount of hydrophobic thermoplastic polymer particles relative to the total weight of the ingredients of the imaging layer is at least 60%.

13 Claims, No Drawings

NEGATIVE WORKING, HEAT SENSITIVE LITHOGRAPHIC PRINTING PLATE PRECURSOR

CROSS-REFERENCE TO RELATED APPLICATIONS

This application is a 371 National Stage Application of PCT/EP2007/054950, filed May 22, 2007. This application claims the benefit of U.S. Provisional Application No. 60/804,188, filed Jun. 8, 2006, which is incorporated by reference herein in its entirety. In addition, this application claims the benefit of European Application No. 06114473.9, filed May 24, 2006, which is also incorporated by reference herein in its entirety.

BACKGROUND OF THE INVENTION

1. Field of the Invention

The present invention relates to a heat-sensitive, negative-working lithographic printing plate precursor.

2. Description of the Related Art

Lithographic printing presses use a so-called printing master such as a printing plate which is mounted on a cylinder of the printing press. The master carries a lithographic image on its surface and a print is obtained by applying ink to the image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e., ink-accepting, water-repelling) areas as well as hydrophilic (or oleophobic, i.e., water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the image-wise exposure and processing of an imaging material called a plate precursor. In addition to the well-known photosensitive, so-called pre-sensitized plates, which are suitable for UV contact exposure through a film mask, heat-sensitive printing plate precursors have also become very popular in the late 1990s. Such thermal materials offer the advantage of daylight stability and are especially used in the so-called computer-to-plate method wherein the plate precursor is directly exposed, i.e., without the use of a film mask. The material is exposed to heat or to infrared light and the generated heat triggers a (physico-) chemical process, such as ablation, polymerization, insolubilization by cross linking of a polymer, heat-induced solubilization, or particle coagulation of a thermoplastic polymer latex.

The most popular thermal plates form an image by a heat-induced solubility difference in an alkaline developer between exposed and non-exposed areas of the coating. The coating typically includes an oleophilic binder, e.g., a phenolic resin, of which the rate of dissolution in the developer is either reduced (negative working) or increased (positive working), by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in, e.g., EP-A 625 728, EP-A 823 327, EP-A 825 927, EP-A 864 420, EP-A 894 622 and EP-A 901 902. Negative working embodiments of such thermal materials often require a pre-heat step between exposure and development as described in, e.g., EP-A 625 728.

Negative working plate precursors which do not require a pre-heat step may contain an image-recording layer that works by heat-induced particle coalescence of a thermoplastic polymer latex, as described in, e.g., EP-A 770 494, EP-A 770 495, EP-A 770 496 and EP-A 770 497. These patents disclose a method for making a lithographic printing plate including the steps of (1) image-wise exposing an imaging element including hydrophobic thermoplastic polymer particles dispersed in a hydrophilic binder and a compound capable of converting light into heat and (2) developing the image-wise exposed element by applying fountain solution and/or ink.

EP-A 849 091 discloses a printing plate precursor including hydrophobic thermoplastic particles having an average particles size of 40 nm to 150 nm and a polydispersity of less than 0.2.

EP-A 1 342 568 describes a method of making a lithographic printing plate including the steps of (1) image-wise exposing an imaging element including hydrophobic thermoplastic polymer particles dispersed in a hydrophilic binder and a compound capable of converting light into heat and (2) developing the image-wise exposed element by applying a gum solution, thereby removing non-exposed areas of the coating from the support.

WO 2006/037716 describes a method for preparing a lithographic printing plate which includes the steps of (1) image-wise exposing an imaging element including hydrophobic thermoplastic polymer particles dispersed in a hydrophilic binder and a compound capable of converting light into heat and (2) developing the image-wise exposed element by applying a gum solution, thereby removing non-exposed areas of the coating from the support and characterized by an average particle size of the thermoplastic polymer particles between 40 nm and 63 nm and wherein the amount of the hydrophobic thermoplastic polymer particles is more than 70% and less than 85% by weight, relative to the image recording layer. The amount of infrared absorbing dye, hereinafter referred to as IR dye, used in this invention is preferably more than 6% by weight relative to the image recording layer.

EP-A 1 614 538 describes a negative working lithographic printing plate precursor which includes a support having a hydrophilic surface or which is provided with a hydrophilic layer and a coating provided thereon, the coating including an image-recording layer which includes hydrophobic thermoplastic polymer particles and a hydrophilic binder, characterized in that the hydrophobic thermoplastic polymer particles have an average particle size in the range from 45 nm to 63 nm, and that the amount of the hydrophobic thermoplastic polymer particles in the image-recording layer is at least 70% by weight relative to the image-recording layer. The amount of IR dye used in this invention is preferably more than 6%, more preferably more than 8%, by weight relative to the image recording layer.

EP-A 1 614 539 and EP-A 1 614 540 describe a method of making a lithographic printing plate including the steps of (1) image-wise exposing an imaging element disclosed in EP-A 1 614 538 and (2) developing the image-wise exposed element by applying an aqueous, alkaline solution.

EP-A 1 564 020 describes a printing plate including a hydrophilic support and provided thereon, an image formation layer containing thermoplastic resin particles in an amount from 60 to 100% by weight, the thermoplastic particles having a glass transition point (Tg) and an average particle size of from 0.01 to 2 μm, more preferably from 0.1 to 2 μm. As thermoplastic particles, polyester resins are preferred. EP 1 564 020 discloses printing plate precursors including polyester thermoplastic particles, of which the particle size is 160 nm.

The unpublished EP-A 06 111 322 (filed 2006-03-17) describes a negative working lithographic printing plate precursor which includes a support having a hydrophilic surface or which is provided with a hydrophilic layer and a coating provided thereon, the coating including an image-recording layer which includes hydrophobic thermoplastic polymer particles and a hydrophilic binder, characterized in that the hydrophobic thermoplastic polymer particles include a polyester and have an average particle diameter from 18 nm to 50 nm.

A first problem associated with negative-working printing plates that work according to the mechanism of heat-induced latex-coalescence is the complete removal of the non-exposed areas during the development step (i.e., clean-out). An insufficient clean-out may result in toning on the press, i.e., an undesirable increased tendency of ink-acceptance in the non-image areas. This clean-out problem tends to become worse when the particle size of the thermoplastic particles used in the printing plate decreases, as mentioned in EP-A 1 614 538, EP-A 1 614 539, EP-A 1 614 540 and WO 2006/037716.

A decrease of the particle diameter of the hydrophobic thermoplastic particles in the imaging layer may, however, further increase the sensitivity of the printing plate precursor.

According to EP 1 834 764 a good clean out is obtained, even with particle sizes from 18 nm to 50 nm, when the hydrophobic thermoplastic polymer particles include a polyester. The sensitivity of the lithographic printing plate precursors including the thermoplastic polymer particles remains, however, rather low.

The rather low sensitivity of negative-working printing plates that work according to the mechanism of heat-induced latex-coalescence is a second problem to be solved. A printing plate precursor characterized by a low sensitivity needs a longer exposure time and therefore results in a lower throughput (i.e., lower number of printing plate precursors that can be exposed in a given time interval).

SUMMARY OF THE INVENTION

In order to overcome the problems described above, preferred embodiments of the present invention provide a negative working, heat-sensitive lithographic printing plate precursor, that works according to the mechanism of heat-induced latex-coalescence, having a high sensitivity and excellent printing properties with reduced or no toning.

According to a preferred embodiment of the present invention, a heat-sensitive negative-working lithographic printing plate precursor includes a support having a hydrophilic surface or which is provided with a hydrophilic layer and a coating provided thereon, the coating including an image-recording layer which includes hydrophobic thermoplastic polymer particles, a binder and an infrared (IR) absorbing dye; wherein the hydrophobic thermoplastic polymer particles have an average particle diameter, measured by Photon Correlation Spectroscopy, of more than 10 nm and less than 40 nm, the amount of the IR-dye, without taking into account an optional counter ion, is more than 0.80 mg per $m^2$ of the total surface (i.e., total surface area) of the thermoplastic polymer particles, and the amount of hydrophobic thermoplastic polymer particles relative to the total weight of the ingredients of the imaging layer is at least 60%.

Other features, elements, characteristics, features, steps and advantages of the present invention will become more apparent and described in more detail in the following detailed description of preferred embodiments thereof.

DETAILED DESCRIPTION OF THE PREFERRED EMBODIMENTS

The lithographic printing plate precursor includes a coating on a hydrophilic support. The coating may include one or more layers. The layer of the coating including the hydrophobic thermoplastic particles is referred to herein as the image-recording layer.

Hydrophobic Thermoplastic Particles

The hydrophobic particles have an average particle diameter of more than 10 nm and less than 40 nm, preferably more than 15 nm and less than 38 nm, and more preferably more than 20 and less than 36 nm. The average particle diameter referred to in the description of preferred embodiments of the present invention means the average particle diameter measured by Photon Correlation Spectrometry ($Ø_{PCS}$), also known as Quasi-Elastic or Dynamic Light-Scattering, unless otherwise specified. The measurements were performed according the ISO 13321 procedure (First Edition, 1996 Jul. 1) with a Brookhaven BI-90 analyzer, commercially available from Brookhaven Instrument Company, Holtsville, N.Y., USA.

An alternative method to measure the average particle diameter is based on hydrodynamic fractionation. With this technique, a volume distribution of the particles is obtained from which a volume average particle diameter is calculated ($Ø_V$). In the examples, the volume average particle diameter, measured according to this technique, is obtained with a PL-PSDA apparatus (Polymer Laboratories Particle Size Diameter Analyser) from Polymer Laboratories Ltd. Church Stretton, Shropshire, UK. From the volume distribution, obtained with the PL-PSDA apparatus, the total surface of the hydrophobic particles (expressed as square meter per gram hydrophobic particles, $m^2/g$) can be calculated. In these calculations, the density ($g/cm^3$) of the thermoplastic particles has to be taken into account. The density of different polymers can be found, for example, in the handbook "Properties of Polymers, Their Estimation and Correlation with Chemical Structures" by D. W. Van Krevelen, from Elsevier Scientific Publishing Company, Second Edition, pages 574 to 581. The density may also be measured. For particles or lattices, the so-called skeletal (definition according to ASTM D3766 standard) density may be measured according to the gas displacement method.

The amount of hydrophobic thermoplastic polymer particles is at least 60, preferably at least 65, more preferably at least 70 percent by weight relative to the weight of all the ingredients in the image-recording layer.

The hydrophobic thermoplastic polymer particles which are present in the coating are preferably selected from polyethylene, poly-(vinyl)chloride, polymethyl(meth)acrylate, polyethyl(meth)acrylate, polyvinylidene chloride, poly (meth)acrylonitrile, polyvinyl-carbazole, polystyrene or copolymers thereof.

According to a preferred embodiment of the present invention, the thermoplastic polymer particles include polystyrene or derivatives thereof, mixtures including polystyrene and poly(meth)acrylonitrile or derivatives thereof, or copolymers including polystyrene and poly(meth)-acrylonitrile or derivatives thereof. The latter copolymers may include at least 50 wt. % of polystyrene, more preferably at least 65 wt. % of polystyrene. In order to obtain sufficient resistivity towards organic chemicals such as hydrocarbons used in, e.g., plate cleaners, the thermoplastic polymer particles preferably include at least 5 wt. %, more preferably at least 30 wt. %, of nitrogen containing units, such as (meth)acrylonitrile, as described in EP-A 1 219 416. According to a preferred embodiment, the thermoplastic polymer particles consist essentially of styrene and acrylonitrile units in a weight ratio between 1:1 and 5:1 (styrene:acrylonitrile), e.g., in a 2:1 ratio.

In a preferred embodiment of the present invention, the hydrophobic thermoplastic particles do not include polyester.

The weight average molecular weight of the thermoplastic polymer particles may range from 5,000 to 1,000,000 g/mol.

The hydrophobic thermoplastic polymer particles can be prepared by addition polymerization or by condensation polymerization. They are preferably applied onto the lithographic base in the form of a dispersion in an aqueous coating liquid. These water based dispersions can be prepared by polymerization in a water-based system e.g., by free-radical emulsion polymerization as described in U.S. Pat. No. 3,476,937 or EP-A 1 217 010 or by dispersing techniques of the water-insoluble polymers into water. Another method for preparing an aqueous dispersion of the thermoplastic polymer particles includes (1) dissolving the hydrophobic thermoplastic polymer in an organic water immiscible solvent, (2) dispersing the thus obtained solution in water or in an aqueous medium and (3) removing the organic solvent by evaporation.

Emulsion polymerization is typically carried out through controlled addition of several components, i.e., vinyl monomers, surfactants (dispersion aids), initiators and optionally other components such as buffers or protective colloids, to a continuous medium, usually water. The resulting polymer is a dispersion of discrete particles in water. The surfactants or dispersion aids which are present in the reaction medium have multiple roles in the emulsion polymerization: (1) they reduce the interfacial tension between the monomers and the aqueous phase, (2) they provide reaction sites through micelle formation in which the polymerization occurs and (3) they stabilize the growing polymer particles and ultimately the latex emulsion. The surfactants are absorbed at the water/polymer interface and thereby prevent coagulation of the fine polymer particles. Non-ionic, cationic and anionic surfactants may be used in emulsion polymerization. Preferably, non-ionic or anionic surfactants are used. Most preferably, the hydrophobic thermoplastic particles are stabilized with an anionic dispersion aid. Specific examples of suitable anionic dispersion aids include sodium lauryl sulphate, sodium lauryl ether sulphate, sodium dodecyl sulphate, sodium dodecyl benzene sulphonate and sodium lauryl phosphate; suitable non-ionic dispersion aids are, for example, ethoxylated lauryl alcohol and ethoxylated octylphenol.

IR Absorbing Compounds

The coating preferably contains a dye which absorbs infrared (IR) light and converts the absorbed energy into heat. Preferred IR absorbing dyes are cyanine, merocyanine, indoaniline, oxonol, pyrilium and squarilium dyes. Examples of suitable IR absorbers are described in e.g., EP-A 823 327, EP-A 978 376, EP-A 1 029 667, EP-A 1 053 868, EP-A 1 093 934 and WO 97/39894 and WO 00/29214.

Other preferred IR-dyes are described in EP 1 614 541 (page 20 line 25 to page 44 line 29) and the unpublished EP-A 05 105 440 (filed 2005-06-21). These IR-dyes are especially preferred in the on-press development embodiment of the present invention since these dyes give rise to a print-out image after exposure to IR-light, prior to development on press. IR-dyes preferably used in preferred embodiments of the present invention are water compatible, most preferably water soluble.

In the prior art, e.g., in WO 2006/037716, the preferred IR-dye amount is at least 6% by weight relative to the image recording layer, irrespective of the average particle diameter of the hydrophobic thermoplastic particles used. According to WO 2006/037716, lithographic printing plates including hydrophobic thermoplastic particles with a particle size less than 40 nm have inferior lithographic properties, i.e., a bad clean-out (e.g., Comparative Example 2, average particle diameter=36 nm).

It has surprisingly been discovered that lithographic printing plates including hydrophobic thermoplastic particles with a particle size of more than 10 nm and less than 40 nm, characterized by a good clean-out and a high sensitivity, are obtained by adjusting the amount of IR-dye in relation to the amount and the average particle diameter of the thermoplastic particles. As a result of this investigation, it has been discovered that by adjusting the amount of IR-dye in relation to the total surface of the hydrophobic thermoplastic particles present in the image-recording layer, printing plate precursors with optimum lithographic properties are obtained. The total surface of the hydrophobic thermoplastic particles is calculated as described above and in the examples. A possible explanation of this phenomenon may be that all or a portion of the IR-dyes adsorb on the surface of the hydrophobic particles and render the particles more dispersible in aqueous solutions (e.g., fountain solution or the gumming solution) resulting in an improved clean-out behavior. Since it is believed that optional counter ions of the IR-dyes (i.e., when the IR-dyes are used as salts) do not have an essential contribution, the amount of IR-dye used according to a preferred embodiment of the present invention is meant to be the amount of IR-dye without taking into account an optional counter ion. A good clean-out and superior sensitivity with lithographic printing plates including hydrophobic thermoplastic particles with a particle diameter of more than 10 nm and less than 40 nm, is obtained when the amount of IR-dye, without taking into account an optional counter ion, is more than 0.80 mg, preferably more than 0.90 mg, more preferably more than 1.00 mg and most preferably more than 1.20 mg per $m^2$ of the total surface of the thermoplastic polymer particles. These findings imply that when the average particle diameter of the hydrophobic thermoplastic particles decreases (and the amount of particles ($g/m^2$) in the imaging layer remains constant) the amount of IR dye in the imaging layer must be increased to maintain good lithographic properties. Referring to the comparative example of WO 2006/037716 mentioned above, the amount of IR-dye, without taking into account the counter ion, used therein is less than 0.80 mg per $m^2$ of the total surface of the thermoplastic polymer particles, having an average particle diameter of 36 nm.

There is no particular upper limit for the amount of IR-dye. However, when the total infrared optical density (e.g., at 830 nm) of the coating becomes too high, the IR-light emitted from the exposure source, may not reach the lower portions of the imaging layer, resulting in a poor coalescence of the thermoplastic polymer particles at the portion of the imaging layer that makes contact with the support. This may be overcome with a higher energy exposure, but results in a lower throughput (numbers of printing plate precursors that can be exposed in a given time interval). The maximum optical density at 830 nm of the coating, obtained from diffuse reflectance spectra, measured with a Shimadzu UV-3101 PC/ISR-3100 spectrophotometer, is preferably less than 2.00, more preferably less than 1.50, and most preferably less than 1.25.

Binder

The image-recording layer may further include a hydrophilic binder. Examples of suitable hydrophilic binders are homopolymers and copolymers of vinyl alcohol, (meth)acrylamide, methylol(meth)acrylamide, (meth)acrylic acid, hydroxyethyl(meth)acrylate, maleic anhydride/vinylmethylether copolymers, copolymers of (meth)acrylic acid or vinylalcohol with styrene sulphonic acid. Preferably, the hydrophilic binder includes polyvinylalcohol or polyacrylic acid.

The amount of hydrophilic binder may be between 2.5 and 50 wt. %, preferably between 5 and 25 wt. %, and more preferably between 10 and 15 wt. % relative to the total weight of all ingredients of the image-recording layer.

The amount of the hydrophobic thermoplastic polymer particles relative to the amount of the binder is preferably between 4:1 and 15:1, more preferably between 5:1 and 12:1, and most preferably between 6:1 and 10:1.

Contrast Dyes

Colorants, such as dyes or pigments, which provide a visible color to the coating and remain in the exposed areas of the coating after the processing step may be added to the coating. The image-areas, which are not removed during the processing step, form a visible image on the printing plate and examination of the lithographic image on the developed printing plate becomes feasible. Typical examples of such contrast dyes are the amino-substituted tri- or diarylmethane dyes, e.g., crystal violet, methyl violet, victoria pure blue, flexoblau 630, basonylblau 640, auramine and malachite green. Also, the dyes which are discussed in depth in the detailed description of EP-A 400 706 are suitable contrast dyes. Dyes which, combined with specific additives, only slightly color the coating but which become intensively colored after exposure, as described in, for example, WO 2006/005688 are also of interest.

Other Ingredients

Optionally, the coating may further contain additional ingredients. These ingredients may be present in the image-recording layer or in an optional other layer. For example, additional binders, polymer particles such as matting agents and spacers, surfactants such as perfluoro-surfactants, silicon or titanium dioxide particles, development inhibitors, development accelerators, colorants, metal complexing agents are well-known components of lithographic coatings.

Preferably, the image-recording layer includes an organic compound, wherein the organic compound includes at least one phosphonic acid group or at least one phosphoric acid group or a salt thereof, as described in WO 2007/045515. In a particularly preferred embodiment the image-recording layer includes an organic compound as represented by Formula I:

Formula (I)

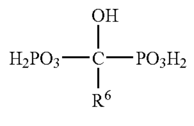

or a salt thereof, and wherein $R^6$ independently represents hydrogen, an optionally substituted straight, branched, cyclic or heterocyclic alkyl group or an optionally substituted aryl or heteroaryl group.

Compounds according to Formula I may be present in the image-recording layer in an amount between 0.05 and 15 wt. %, preferably between 0.5 and 10 wt. %, and more preferably between 1 and 5 wt. % relative to the total weight of the ingredients of the image-recording layer.

Other Layers of the Coating

To protect the surface of the coating, in particular from mechanical damage, a protective layer may optionally be applied on the image-recording layer. The protective layer generally includes at least one water-soluble polymeric binder, such as polyvinyl alcohol, polyvinylpyrrolidone, partially hydrolyzed polyvinyl acetates, gelatin, carbohydrates or hydroxyethylcellulose. The protective layer may contain small amounts, i.e., less than 5% by weight, of organic solvents. The thickness of the protective layer is not particularly limited, but preferably is up to 5.0 μm, more preferably from 0.05 to 3.0 μm, and particularly preferably from 0.10 to 1.0 μm.

The coating may further contain other additional layer(s) such as, for example, an adhesion-improving layer located between the image-recording layer and the support.

Support

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press.

In a preferred embodiment of the present invention, the support is a metal support such as aluminum or stainless steel. The support can also be a laminate including an aluminum foil and a plastic layer, e.g., polyester film. A particularly preferred lithographic support is an aluminum support. Any known and widely used aluminum materials can be used. The aluminum support has a thickness of about 0.1-0.6 mm. However, this thickness can be changed appropriately depending on the size of the printing plate used and the plate-setters on which the printing plate precursors are exposed.

To optimize the lithographic properties, the aluminum support is subjected to several treatments well known in the art such as, for example: degreasing, surface roughening, etching, anodization, and sealing surface treatment. In between such treatments, a neutralization treatment is often carried out. A detailed description of these treatments can be found in, e.g., EP-A 1 142 707, EP-A 1 564 020 and EP-A 1 614 538.

A preferred aluminum substrate, characterized by an arithmetical mean center-line roughness Ra less than 0.45μ is described in EP 1 356 926.

Optimizing the pore diameter and distribution thereof of the grained and anodized aluminum surface as described in EP 1 142 707 and U.S. Pat. No. 6,692,890 may enhance the press life of the printing plate and may improve the toning behavior. Avoiding large and deep pores as described in U.S. Pat. No. 6,912,956 may also improve the toning behavior of the printing plate. An optimal ratio between pore diameter of the surface of the aluminum support and the average particle size of the hydrophobic thermoplastic particles may enhance the press run length of the plate and may improve the toning behavior of the prints. This ratio of the average pore diameter of the surface of the aluminum support to the average particle size of the thermoplastic particles present in the image-recording layer of the coating, preferably ranges from 0.05:1 to 0.8:1, more preferably from 0.10:1 to 0.35:1.

Alternative supports for the plate precursor can also be used, such as amorphous metallic alloys (metallic glasses). Such amorphous metallic alloys can be used as such or joined with other non-amorphous metals such as aluminum. Examples of amorphous metallic alloys are described in U.S. Pat. No. 5,288,344, U.S. Pat. No. 5,368,659, U.S. Pat. No. 5,618,359, U.S. Pat. No. 5,735,975, U.S. Pat. No. 5,250,124, U.S. Pat. No. 5,032,196, U.S. Pat. No. 6,325,868, and U.S. Pat. No. 6,818,078. The following references describe the science of amorphous metals in much more detail and are incorporated herein as references: Introduction to the Theory of Amorphous Metals, N. P. Kovalenko et al. (2001); Atomic Ordering in Liquid and Amorphous Metals, S. I. Popel, et al; Physics of Amorphous Metals, N. P. Kovalenko et al (2001).

According to another preferred embodiment, the support can also be a flexible support, which is provided with a hydrophilic layer. The flexible support may be, e.g., paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent. Particular examples of suitable hydrophilic layers that may be supplied to a flexible support for use in accordance with preferred embodiments of the present invention are disclosed in EP-A 601 240, GB 1 419 512, FR 2 300 354, U.S. Pat. No. 3,971,660, U.S. Pat. No. 4,284,705, EP 1 614 538, EP 1 564 020 and U.S. 2006/0019196.

Exposure

The printing plate precursor is exposed with infrared light, preferably near infrared light. The infrared light is converted into heat by an IR-dye as discussed above. The heat-sensitive lithographic printing plate precursor according to a preferred embodiment of the present invention is preferably not sensitive to visible light. Most preferably, the coating is not sensitive to ambient daylight, i.e., visible (400-750 nm) and near UV light (300-400 nm) at an intensity and exposure time corresponding to normal working conditions so that the material can be handled without the need for a safe light environment.

The printing plate precursors can be exposed to infrared light by, e.g., LEDs or an infrared laser. Preferably, lasers, emitting near infrared light having a wavelength in the range from about 700 to about 1500 nm, e.g., a semiconductor laser diode, a Nd:YAG or a Nd:YLF laser, are used. Most preferably, a laser emitting in the range between 780 and 830 nm is used. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e., the number of addressable pixels per unit of linear distance, often expressed in dots per inch or dpi; typical value: 1000-4000 dpi).

Preferred lithographic printing plate precursors produce a useful lithographic image upon image-wise exposure with IR-light having an energy density, measured at the surface of the precursor, of 200 $mJ/cm^2$ or less, more preferably of 180 $mJ/cm^2$ or less, and most preferably of 160 $mJ/cm^2$ or less. With a useful lithographic image on the printing plate, 2% dots (at 200 lpi) are perfectly visible on at least 1,000 prints on paper.

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T (trademark) is a typical example of a plate-setter using the ITD-technology. XTD plate-setters for thermal plates having a typical laser power from about 20 mW to about 500 mW operate at a lower scan speed, e.g., from 0.1 to 20 m/sec. The Agfa Xcalibur (trademark), Accento (trademark) and Avalon (trademark) plate-setter families make use of the XTD-technology.

Due to the heat generated during the exposure step, the hydrophobic thermoplastic polymer particles may fuse or coagulate so as to form a hydrophobic phase which corresponds to the printing areas of the printing plate. Coagulation may result from heat-induced coalescence, softening, or melting of the thermoplastic polymer particles. There is no specific upper limit to the coagulation temperature of the thermoplastic hydrophobic polymer particles, however, the temperature should be sufficiently below the decomposition temperature of the polymer particles. Preferably, the coagulation temperature is at least 10° C. below the temperature at which the decomposition of the polymer particles occurs. The coagulation temperature is preferably higher than 50° C., more preferably above 100° C.

Development

In a preferred embodiment of the present invention, the printing plate precursor, after exposure, is developed off press by a suitable processing liquid. In the development step, the non-exposed areas of the image-recording layer are at least partially removed without essentially removing the exposed areas, i.e., without affecting the exposed areas to an extent that renders the ink-acceptance of the exposed areas unacceptable. The processing liquid can be applied to the plate, e.g., by rubbing with an impregnated pad, by dipping, immersing, (spin-) coating, spraying, and pouring-on, either by hand or in an automatic processing apparatus. The treatment with a processing liquid may be combined with mechanical rubbing, e.g., by a rotating brush. The developed plate precursor can, if required, be post-treated with rinse water, a suitable correcting agent or preservative as known in the art. During the development step, any water-soluble protective layer present is preferably also removed. Suitable processing liquids are plain water or aqueous solutions.

In a preferred embodiment of the present invention, the processing liquid is a gum solution. A suitable gum solution which can be used in the development step is described in, for example, EP-A 1 342 568 and WO 2005/111727. The development is preferably carried out at temperatures of from 20 to 40° C. in automated processing units as customary in the art. The development step may be followed by a rinsing step and/or a gumming step.

In another preferred embodiment of the present invention, the printing plate precursor is, after exposure, mounted on a printing press and developed on-press by supplying ink and/or fountain solution or a single fluid ink to the precursor.

In another preferred embodiment, development off press with, e.g., a gumming solution, wherein the non-exposed areas of the image recording layer are partially removed, may be combined with a development on press, wherein a complete removal of the non-exposed is achieved.

The plate precursor may be post-treated with a suitable correcting agent or preservative as known in the art. To increase the resistance of the finished printing plate and hence to extend the run length, the layer can be heated to elevated temperatures (so called 'baking'). During the baking step, the plate can be heated at a temperature which is higher than the glass transition temperature of the thermoplastic particles, e.g., between 100° C. and 230° C. for a period of 40 minutes to 5 minutes. A preferred baking temperature is above 60° C. For example, the exposed and developed plates can be baked at a temperature of 230° C. for 5 minutes, at a temperature of 150° C. for 10 minutes or at a temperature of 120° C. for 30 minutes. Baking can be done in conventional hot air ovens or by irradiation with lamps emitting in the infrared or ultraviolet spectrum. As a result of this baking step, the resistance of the printing plate to plate cleaners, correction agents and UV-curable printing inks increases.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. No. 4,045,232; U.S. Pat. No. 4,981,517 and U.S. Pat. No. 6,140,392. In a preferred embodiment, the single-fluid ink includes an ink phase, also called the hydrophobic or oleophilic phase, and a polyol phase as described in WO 00/32705.

EXAMPLES

Preparation Hydrophobic Thermoplastic Particles (LX-01 to LX-04)

Preparation of LX-01:

The polymer emulsion was prepared by a so-called 'seeded emulsion polymerization' technique wherein a portion of the monomers, together with the surfactant, are brought into the reactor, before the initiator is added. All surfactants (2.15 wt. % relative to the total monomer amount) are present in the reactor before the reaction is started. In a 400 l double-jacketed reactor, 17.2 kg of a 10% sodium dodecyl sulphate solution (Texapon K12 obtained from Cognis) and 243.4 kg of demineralized water were added. The reactor was brought under an inert atmosphere by 3 times vacuum/nitrogen exchanging and heated to 75° C. In another flask, the monomer mixture was prepared by mixing 53.04 kg of styrene and 27.0 kg of acrylonitrile. 3.2 l of the monomer mixture was added to the reactor and stirred for 15 min. at 75° C. to homogeneously disperse the 'seed' monomer fraction. Then 6.67 kg of a 2% aqueous solution of sodium persulphate was added (33% of the total initiator amount). After another 5 min. at 75° C., the reactor was heated up to 80° C. in 30 min. At 80° C., the monomer and initiator dosage was started. The monomer mixture (85 l) of acrylonitrile (26.0 kg) and styrene (51.2 kg) were added for 3 hours. Simultaneously with the monomer addition an aqueous persulphate solution was added (13.33 kg of a 2% aqueous $Na_2S_2O_8$ solution) while keeping the reactor at 80° C. Since the reaction is slightly exothermic the reactor jacket was cooled to 74° C., in order to keep the reactor content at 80° C. After the monomer dosage, the reactor temperature was set to 82° C. and stirred for 30 min. To reduce the amount of residual monomer, a redox-initiation system was added: 340 g sodium formaldehyde sulphoxylate dihydrate (SFS) dissolved in 22.81 kg water and 570 g of a 70 wt. % t-butyl hydro peroxide (TBHP) diluted with 4.8 kg of water. The aqueous solutions of SFS and TBHP were added separately for 2 hours and 20 min. The reaction was then heated for another 10 min. at 82° C. followed by cooling to 20° C. 760 g of a 5 wt. % aqueous solution of 5-bromo-5-nitro-1,3-dioxane was added as a biocide and the latex was filtered using a 5 micron filter.

This resulted in the latex dispersion LX-01 with a solid content of 20.68 wt. % and a pH of 3.25.

Preparation of LX-02:

The polymer emulsion was prepared by a 'semi-continuous emulsion' polymerization wherein all monomers (styrene and acrylonitrile) are added to the reactor. All surfactants (3 wt. % relative to the monomer amount) are present in the reactor before the monomer addition was started. In a 2 l double-jacketed reactor, 10.8 g of sodium dodecyl sulphate (Texapon K12 from Cognis) and 1243.9 g of demineralized water were added. The reactor was flushed with nitrogen and heated to 80° C. When the reactor content reached a temperature of 80° C., 12 g of a 5% solution of sodium persulphate in water was added. The reactor was subsequently heated for 15 min. at 80° C. Then, the monomer mixture (238.5 g of styrene and 121.5 g of acrylonitrile) was dosed for 180 min. Simultaneously with the monomer addition, an additional amount of an aqueous persulphate solution was added (24 g of a 5% aqueous $Na_2S_2O_8$ solution). After the monomer addition was finished, the reactor was heated for 30 min. at 80° C. To reduce the amount of residual monomer, a redox-initiation system was added: 1.55 g sodium formaldehyde sulphoxylate dihydrate (SFS) dissolved in 120 g water and 2.57 g of a 70 wt. % t-butyl hydro peroxide (TBHP) diluted with 22.5 g of water. The aqueous solutions of SFS and TBHP were added separately for 80 min. The reactor was then heated for another 10 min. and was subsequently cooled to room temperature. 800 g of a 5 wt. % aqueous solution of 5-bromo-5-nitro-1,3-dioxane was added as a biocide and the latex was filtered using a coarse filter paper.

This resulted in the latex dispersion LX-02 with a solid content of 20.84 wt. % and a pH of 3.71.

Preparation of LX-03:

The latex dispersion LX-03 was prepared similarly to LX-02 with 10 wt. % surfactant (36 g sodium dodecyl sulphate) relative to the monomer amount.

This resulted in the latex dispersion LX-03 with a solid content of 22.80 wt. % and a pH of 4.66.

Preparation of LX-04:

The polymer emulsion was prepared by a 'semi-continuous emulsion' polymerization wherein all monomers (styrene and acrylonitrile) are added to the reactor. All surfactants (2.15 wt. % towards the monomer amount) are present in the reactor before the monomer addition is started. In a 400 l double-jacketed reactor, 17.2 kg of a 10 wt. % aqueous solution of sodium dodecyl sulphate (Texapon K12 from Cognis) and 265 kg of demineralized water were added. The reactor was brought under an inert atmosphere by 3 times vacuum/nitrogen exchange. The reactor content was stirred at 100 rpm and heated to 82° C. When the reactor content reached a temperature of 82° C., 6.67 kg of a 2% of sodium persulphate in water was added. The reactor was subsequently heated for 15 min. at 82° C. Then the monomer mixture (53.04 kg of styrene and 27.0 kg of acrylonitrile) was dosed for 3 hours. Simultaneously with the monomer addition, an aqueous persulphate solution was added (13.34 kg of a 2% aqueous $Na_2S_2O_8$ solution) for 3 hours. The monomer flask was flushed with 5 l of demineralized water. After the monomer addition, the reactor was heated for 60 min. at 82° C. To reduce the amount of residual monomer, a redox-initiation system was added (340 g of sodium formaldehyde sulphoxylate dihydrate (SFS) dissolved in 22.81 kg water and 570 g of a 70 wt. % t-butyl hydro peroxide (TBHP) diluted with 4.8 kg of water. The aqueous solutions of SFS and TBHP were added separately for 2 hours and 20 min. The reaction was then heated for another 10 min. at 82° C. and was subsequently cooled to room temperature. 800 g of a 5 wt. % aqueous solution of 5-bromo-5-nitro-1,3-dioxane was added as a biocide and the latex was filtered using a 5 micron filter.

This resulted in the latex dispersion LX-04 with a solid content of 19.92 wt. % and a pH of 3.2.

Particle Size and Surface of the Hydrophobic Thermoplastic Particles

Two techniques were used to measure the particle diameter of the hydrophobic thermoplastic particles, as described below:

$Ø_{PCS}$: is the particle diameter obtained by Photon Correlation Spectroscopy. The measurements were performed according to the ISO 13321 procedure (First Edition, 1996-07-01) with a Brookhaven BI-90 analyzer from Brookhaven Instrument Company, Holtsville, N.Y., USA.

$Ø_V$: is the volume average particle diameter obtained with hydrodynamic fractionation obtained with a PL-PSDA apparatus (Polymer Laboratories Particle Size Diameter Analyzer) from Polymeric Labs.

From the volume particle size distribution obtained with the PL-PSDA apparatus, the total surface of the hydrophobic thermo-plastic particles (Surface ($m^2$/g)) is calculated. These calculations have been performed with a density (ρ, (g/$cm^3$)) of the particles of 1.10 g/$cm^3$. Since all particles LX-01 to LX-04 have the same composition, they all have the same density. The density of the particles LX-01 to LX-04 (skeletal density according to ASTM D3766 standard) has been measured using the gas displacement method on a Accupyc 1330 helium-pycnometer (from Micromeritics).

The calculations are based on the following formulas:

ρ=Density ($g/cm^3$)

V=Volume of 1 g particles

N=Number of particles in 1 g

S=total Surface of 1 g of particles ($m^2/g$)

$Ø_v$=Volume particle diameter (nm)

1 g of particles has a Volume (V) of $(1/ρ)\cdot 10^{-6}$ $m^3$.

The Volume of 1 spherical particle=$4/3\cdot\pi\cdot(Ø_v/2)^3$.

The number (N) of spherical particles in 1 g is therefore:

$$N = \frac{(1/\rho)\cdot 10^{-6}}{4/3\cdot\pi\cdot(Ø_v/2)^3}$$

The surface of 1 spherical particle=$4\cdot\pi\cdot(Ø_V/2)^2$

The total surface of 1 g spherical particles containing N particles is therefore:

$$S = \frac{(1/\rho)\cdot 10^{-6}}{4/3\cdot\pi\cdot(Ø_v/2)^3}\times 4\cdot\pi\cdot(Ø_V/2)^2$$

or:

$$S(m^2/g) = \frac{6}{\rho\cdot Ø_V(nm)}\cdot 10^3$$

As mentioned above, the total surface of the particles, as given in the examples, are calculated with the PL-PSDA apparatus, taking into account the volume distribution of the particles. As an approximation, the calculations may also be performed taking into account only the volume average particle size ($Ø_V$).

In Table 1, $Ø_{PCS}$, $Ø_V$ and the total Surface of LX-01 to LX-04 are given.

TABLE 1

$Ø_{PCS}$, $Ø_V$, and Total Surface of LX-01 to LX-04

| | LX-01 | LX-02 | LX-03 | LX-04 |
|---|---|---|---|---|
| $Ø_{PCS}$ (nm) | 59 | 37 | 21 | 45 |
| $Ø_V$ (nm) | 53 | 34 | 22 | 41 |
| surface ($m^2/g$) | 98 | 160 | 216 | 132 |

Preparation of the Lithographic Substrate

A 0.3 mm thick aluminum foil was degreased by spraying with an aqueous solution containing 34 g/l NaOH at 70° C. for 6 seconds and rinsed with demineralized water for 3.6 seconds. The foil was then electrochemically grained for 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm2 (charge density of about 800 C./$dm^2$). Afterwards, the aluminum foil was desmutted by etching with an aqueous solution containing 145 g/l of sulphuric acid at 80° C. for 5 seconds and rinsed with demineralized water for 4 seconds. The foil was subsequently subjected to anodic oxidation for 10 seconds in an aqueous solution containing 145 g/l of sulphuric acid at a temperature of 57° C. and a current density of 33 A/$dm^2$ (charge density of 330 C/$dm^2$), then washed with demineralized water for 7 seconds and post-treated for 4 seconds (by spray) with a solution containing 2.2 g/l PVPA at 70° C., rinsed with demineralized water for 3.5 seconds and dried at 120° C. for 7 seconds. The support thus obtained is characterized by a surface roughness Ra of 0.35-0.4 μm (measured with interferometer NT1100) and having an anodic weight of about 4.0 $g/m^2$.

Ingredients Used in the Preparation of the Printing Plate Precursors

PAA: Polyacrylic acid from Ciba Specialty Chemicals. PAA was added to the coating solutions as a 5 wt % aqueous solution.

IR-1: Chemical formula, see Table 2. IR-1 was added to the coating solutions as a 1 wt % aqueous solution.

IR-2: Chemical formula, see Table 2. IR-2 was added to the coating solutions as a 1 wt % aqueous solution.

IR-3: Chemical formula, see Table 2. IR-3 was added to the coating solutions as a solid.

IR-4: Chemical formula, see Table 2. IR-4 was added to the coating solutions as a 1 wt % aqueous solution.

HEDP: 1-hydroxyethylidene-1,1-diphosphonic acid from Solutia. HEDP was added to the coating solutions as a 10 wt % aqueous solution.

FSO 100: Zonyl FSO 100, a fluor surfactant from Dupont.

CD-01: 5% aqueous dispersion of a modified Cu-phthalocyanine IJX 883 from Cabot Corporation.

CD-02: 20% aqueous dispersion of a phthalocyanine Heliogen Blau D7490 from BASF. The dispersion is stabilized with an anionic surfactant.

CD-03: 20% aqueous dispersion of PV Fast Violet RL from Clariant. The dispersion is stabilized with an anionic surfactant.

TABLE 2

Chemical Structure of the IR dyes IR-1 to IR-4

| IR Dye | Chemical Structure |
|---|---|
| IR-1 | 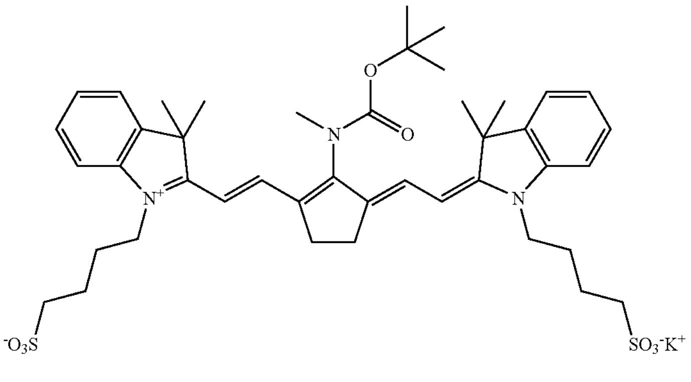 |

TABLE 2-continued

| Chemical Structure of the IR dyes IR-1 to IR-4 | |
|---|---|
| IR Dye | Chemical Structure |
| IR-2 | 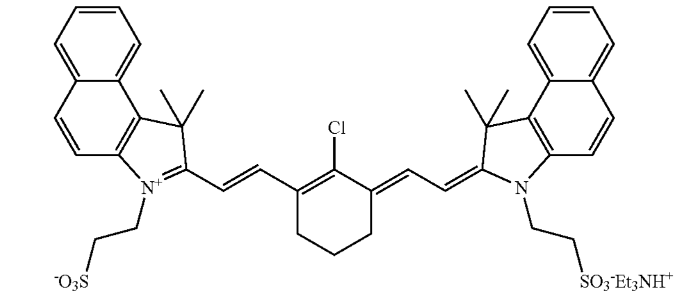 |
| IR-3 | 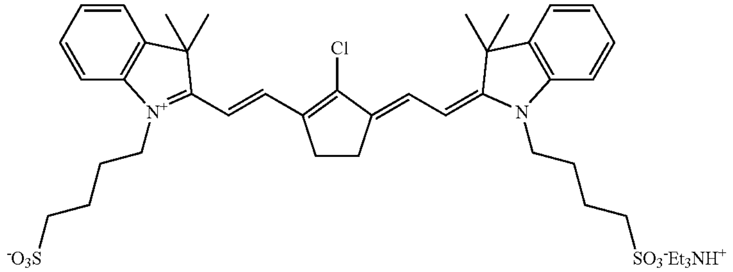 |
| IR-4 | 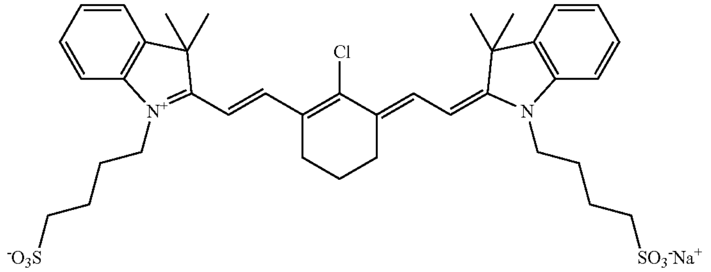 |

Example 1

Printing Plate Precursors PPP-1 to PPP-30

Preparation of the Coating Solutions

The coating solutions for the printing plate precursors 1 to 30 were prepared using the solutions or dispersions as described above. The latex dispersions (LX) were added to demineralized water followed by stirring for 10 minutes and addition of the IR-dye. After 60 minutes of stirring the poly acrylic acid (PAA) solution was added followed by stirring for 10 minutes and addition of the HEDP solution. Subsequently, after another 10 minutes of stirring the surfactant solution was added and the coating dispersion was stirred for another 30 minutes. Subsequently, the pH was adjusted to a value of 3.6 with a diluted ammonia solution (ca 3%).

Preparation of the Printing Plate Precursors

The printing plate precursor coating solutions were subsequently coated on the aluminum substrate, as described above, with a coating knife at a wet thickness of 30 μm. The coatings were dried at 60° C. Table 3 lists the resulting dry coating weight of the different components of the printing plate precursors.

TABLE 3

Dry Coating Weight (g/m$^2$) of Ingredients of PPP-01 to PPP-30

| | PPP | | | | | |
|---|---|---|---|---|---|---|
| | PPP-01 (COMP) | PPP-02 (COMP) | PPP-03 (COMP) | PPP-04 (INV) | PPP-05 (INV) | PPP-06 (INV) |
| LX-01 | 0.585 | 0.439 | 0.293 | — | — | — |
| LX-02 | — | — | — | 0.56 | 0.42 | 0.28 |
| LX-03 | — | — | — | — | — | — |
| IR-1 | 0.093 | 0.070 | 0.047 | 0.094 | 0.071 | 0.047 |
| PAA | 0.090 | 0.068 | 0.045 | 0.114 | 0.086 | 0.057 |
| HEDP | 0.020 | 0.015 | 0.010 | 0.020 | 0.015 | 0.010 |
| FSO 100 | 0.008 | 0.006 | 0.004 | 0.008 | 0.006 | 0.004 |
| Sum ingredients | 0.796 | 0.597 | 0.398 | 0.796 | 0.597 | 0.398 |

TABLE 3-continued

Dry Coating Weight (g/$m^2$) of Ingredients of PPP-01 to PPP-30

| | PPP | | | | | |
|---|---|---|---|---|---|---|
| | PPP-07 (INV) | PPP-08 (INV) | PPP-09 (INV) | PPP-10 (COMP) | PPP-11 (COMP) | PPP-12 (COMP) |
| LX-01 | — | — | — | — | — | — |
| LX-02 | 0.535 | 0.401 | 0.267 | — | — | — |
| LX-03 | — | — | — | 0.566 | 0.425 | 0.283 |
| IR-1 | 0.135 | 0.102 | 0.068 | 0.094 | 0.070 | 0.047 |
| PAA | 0.109 | 0.082 | 0.054 | 0.105 | 0.079 | 0.053 |
| HEDP | 0.019 | 0.014 | 0.009 | 0.018 | 0.014 | 0.009 |
| FSO 100 | 0.008 | 0.006 | 0.004 | 0.013 | 0.010 | 0.006 |
| Sum ingredients | 0.805 | 0.604 | 0.403 | 0.796 | 0.597 | 0.398 |

| | PPP | | | | | |
|---|---|---|---|---|---|---|
| | PPP-13 (INV) | PPP-14 (INV) | PPP-15 (INV) | PPP-16 (INV) | PPP-17 (COMP) | PPP-18 (INV) |
| LX-01 | — | — | — | — | 0.262 | — |
| LX-02 | — | — | — | — | — | 0.250 |
| LX-03 | 0.545 | 0.409 | 0.272 | 0.506 | — | — |
| IR-1 | 0.120 | 0.090 | 0.060 | 0.168 | 0.083 | 0.084 |
| PAA | 0.101 | 0.076 | 0.051 | 0.094 | 0.041 | 0.051 |
| HEDP | 0.017 | 0.013 | 0.009 | 0.016 | 0.009 | 0.009 |
| FSO 100 | 0.012 | 0.009 | 0.006 | 0.011 | 0.003 | 0.004 |
| Sum ingredients | 0.796 | 0.597 | 0.398 | 0.796 | 0.400 | 0.400 |

| | PPP | | | | | |
|---|---|---|---|---|---|---|
| | PPP-19 (INV) | PPP-20 (COMP) | PPP-21 (COMP) | PPP-22 (COMP) | PPP-23 (INV) | PPP-24 (INV) |
| LX-01 | — | — | — | — | — | — |
| LX-02 | — | — | — | — | — | — |
| LX-03 | 0.253 | 0.178 | 0.115 | 0.105 | 0.261 | 0.240 |
| IR-1 | 0.084 | 0.079 | 0.057 | 0.069 | 0.087 | 0.080 |
| PAA | 0.047 | 0.033 | 0.021 | 0.019 | 0.036 | 0.034 |
| HEDP | 0.008 | 0.006 | 0.004 | 0.003 | 0.008 | 0.008 |
| FSO 100 | 0.006 | 0.004 | 0.003 | 0.002 | 0.006 | 0.005 |
| Sum ingredients | 0.400 | 0.300 | 0.200 | 0.200 | 0.400 | 0.370 |

| | PPP | | | | | |
|---|---|---|---|---|---|---|
| | PPP-25 (INV) | PPP-26 (INV) | PPP-27 (INV) | PPP-28 (INV) | PPP-29 (INV) | PPP-30 (INV) |
| LX-01 | — | — | — | — | — | — |
| LX-02 | — | — | — | 0.510 | 0.542 | 0.542 |
| LX-03 | 0.272 | 0.305 | 0.272 | — | — | — |
| IR-1 | 0.090 | 0.101 | 0.090 | 0.081 | 0.102 | 0.108 |
| PAA | 0.038 | 0.043 | 0.025 | 0.105 | 0.081 | 0.081 |
| HEDP | 0.009 | 0.010 | 0.024 | 0.018 | 0.018 | 0.018 |
| FSO 100 | 0.006 | 0.007 | 0.006 | 0.007 | 0.007 | 0.007 |
| Sum ingredients | 0.420 | 0.460 | 0.420 | 0.720 | 0.750 | 0.760 |

Exposure and Printing of Printing Plate Precursors PPP-01 to PPP-30

The printing plate precursors were exposed on a Creo Trend-Setter 3244 40 W fast head IR-laser plate-setter at 300, 250, 200, 150, 100 mJ/$cm^2$ at 150 rotations per minute (rpm) with a 200 line per inch (lpi) screen and an addressability of 2400 dpi. The exposed printing plate precursors were directly mounted on a GTO46 printing press without any processing or pre-treatment. A compressible blanket was used and printing was performed with the fountain solution Agfa Prima FS101 (trademark) and K+E 800 black ink (trademark). The following start-up procedure was used: first 5 revolutions with the dampening form rollers engaged, then 5 revolutions with both the dampening and ink form rollers engaged, then printing started. 1,000 prints were made on 80 g offset paper.

Evaluation of the Printing Plate Precursors PPP-01 to PPP-30

Evaluation of the printing plate precursors was performed with the following parameters:

Sensitivity 1: Plate sensitivity (2% dot) (mJ/$cm^2$): the lowest exposure energy density at which 2% dots (200 lpi) are perfectly visible (by a 5× magnifying glass) on the one-thousandth print on paper.

Sensitivity 2: Plate sensitivity (1×1 CHKB & 8×8 CHKB) ($mJ/cm^2$): the interpolated exposure energy density where the measured optical density on the one-thousandth print on paper of the 1 pixel×1 pixel (1×1) checkerboards (CHKB) equals the measured optical density of the 8 pixel×8 pixel (8×8) checkerboards (CHKB). At a resolution of 2400 dots per inch (dpi), one pixel measures theoretically 10.56 μm×10.56 μm. This method allows for a more precise determination of the laser sensitivity of a printing plate.

Clean-out: The number of prints needed to yield an optical density value in the non-image areas, on the printed paper, of ≦0.005. A good working plate should have a value of less than 25 prints before a sufficient clean out is achieved.

The optical densities referred to above are all measured with a Gretag Macbeth densitometer Type D19C.

In Table 4, the lithographic properties are given together with the following characteristics of the lithographic printing plate precursors: $Ø_{PCS}$, $Ø_V$, Surface ($m^2/g$) (see above) and IR-dye/Surf.: amount of IR-dye (mg), without taken into account the counter ion, per $m^2$ of the total surface of the particles ($mg/m^2$).

Latex wt. %: amount of Latex relative to the total amount of ingredients in the imaging layer (wt. %).

Latex/PAA: amount of Latex relative to the amount of the polyacrylic acid (PAA) binder.

Dry Coating Weight: total amount of all ingredients of the dried image-recording layer ($g/m^2$).

TABLE 4

Evaluation PPP-01 to PPP-30

| | PPP | | | | | |
|---|---|---|---|---|---|---|
| | PPP-01 (COMP) | PPP-02 (COMP) | PPP-03 (COMP) | PPP-04 (INV) | PPP-05 (INV) | PPP-06 (INV) |
| $Ø_{PCS}$ (nm) | 59 | 59 | 59 | 37 | 37 | 37 |
| $Ø_V$ (nm) | 53 | 53 | 53 | 34 | 34 | 34 |
| Surface ($m^2/g$) | 98 | 98 | 98 | 160 | 160 | 160 |
| IR-dye/Surf. ($mg/m^2$) | 1.55 | 1.55 | 1.55 | 1.00 | 1.00 | 1.00 |
| Latex wt. % | 73.47 | 73.47 | 73.47 | 70.30 | 70.30 | 70.30 |
| Latex/PAA | 6.5 | 6.5 | 6.5 | 4.9 | 4.9 | 4.9 |
| Dry Coating Weight | 0.796 | 0.597 | 0.398 | 0.796 | 0.597 | 0.398 |
| Sensitivity 1 | 150 | 150 | 150 | 150 | 150 | 100 |
| Sensitivity 2 | 229 | 228 | 268 | 170 | 168 | 168 |
| Clean out | 1 | 1 | 1 | 20 | 20 | 20 |

| | PPP | | | | | |
|---|---|---|---|---|---|---|
| | PPP-07 (INV) | PPP-08 (INV) | PPP-09 (INV) | PPP-10 (COMP) | PPP-11 (COMP) | PPP-12 (COMP) |
| $Ø_{PCS}$ (nm) | 37 | 37 | 37 | 21 | 21 | 21 |
| $Ø_V$ (nm) | 34 | 34 | 34 | 22 | 22 | 22 |
| Surface ($m^2/g$) | 160 | 160 | 160 | 216 | 216 | 216 |
| IR-dye/Surf. ($mg/m^2$) | 1.50 | 1.51 | 1.51 | 0.74 | 0.74 | 0.74 |
| Latex wt. % | 66.36 | 66.36 | 66.36 | 71.10 | 71.10 | 71.10 |
| Latex/binder | 4.9 | 4.9 | 4.9 | 5.37 | 5.37 | 5.37 |
| Dry Coating Weight | 0.805 | 0.604 | 0.403 | 0.796 | 0.597 | 0.398 |
| Sensitivity 1 | 150 | 150 | 100 | — | — | — |
| Sensitivity 2 | 178 | 154 | 202 | — | — | — |
| Clean out | 1 | 1 | 5 | >1000 | >1000 | >1000 |

| | PPP | | | | | |
|---|---|---|---|---|---|---|
| | PPP-13 (INV) | PPP-14 (INV) | PPP-15 (INV) | PPP-16 (INV) | PPP-17 (COMP) | PPP-18 (INV) |
| $Ø_N$ (nm) | 21 | 21 | 21 | 21 | 59 | 37 |
| $Ø_V$ (nm) | 22 | 22 | 22 | 22 | 53 | 34 |
| Surface ($m^2/g$) | 216 | 216 | 216 | 216 | 98 | 160 |
| IR-dye/Surf. ($mg/m^2$) | 0.96 | 0.96 | 0.96 | 1.46 | 3.08 | 2.00 |
| Latex wt. % | 68.41 | 68.41 | 68.41 | 63.60 | 65.79 | 62.84 |
| Latex/binder | 5.37 | 5.37 | 5.37 | 5.37 | 6.5 | 4.90 |
| Dry Coating Weight | 0.796 | 0.597 | 0.398 | 0.796 | 0.400 | 0.400 |
| Sensitivity 1 | 100 | 100 | 100 | 150 | 225 | 150 |
| Sensitivity 2 | 166 | 127 | 138 | 185 | 206 | 158 |
| Clean out | 10 | 10 | 10 | 1 | 1 | 2 |

| | PPP | | | | | |
|---|---|---|---|---|---|---|
| | PPP-19 (INV) | PPP-20 (COMP) | PPP-21 (COMP) | PPP-22 (COMP) | PPP-23 (INV) | PPP-24 (INV) |
| $Ø_N$ (nm) | 21 | 21 | 21 | 21 | 21 | 21 |
| $Ø_V$ (nm) | 22 | 22 | 22 | 22 | 22 | 22 |

TABLE 4-continued

| Evaluation PPP-01 to PPP-30 | | | | | | |
|---|---|---|---|---|---|---|
| Surface ($m^2/g$) | 216 | 216 | 216 | 216 | 216 | 216 |
| IR-dye/Surf. ($mg/m^2$) | 1.46 | 1.96 | 2.19 | 2.89 | 1.47 | 1.47 |
| Latex wt. % | 63.60 | 59.49 | 57.53 | 52.52 | 65.54 | 65.54 |
| Latex/binder | 5.4 | 5.4 | 5.4 | 5.4 | 7.2 | 7.16 |
| Dry Coating Weight | 0.400 | 0.300 | 0.200 | 0.200 | 0.400 | 0.370 |
| Sensitivity 1 | 150 | 200 | 275 | 225 | 125 | 130 |
| Sensitivity 2 | 150 | 221 | 325 | 325 | 165 | 120 |
| Clean out | 1 | 1 | 1 | 1 | 1 | 1 |
| | PPP | | | | | |
| | PPP-25 (INV) | PPP-26 (INV) | PPP-27 (INV) | PPP-28 (INV) | PPP-29 (INV) | PPP-30 (INV) |
| $Ø_{PCS}$ (nm) | 21 | 21 | 21 | 37 | 37 | 37 |
| $Ø_v$ (nm) | 22 | 22 | 22 | 34 | 34 | 34 |
| Surface ($m^2/g$) | 216 | 216 | 216 | 160 | 160 | 160 |
| IR-dye/Surf.($mg/m^2$) | 1.46 | 1.46 | 1.46 | 0.95 | 1.12 | 1.20 |
| Latex wt. % | 65.54 | 65.55 | 65.14 | 70.74 | 72.27 | 71.69 |
| Latex/binder | 7.16 | 7.17 | 10.8 | 4.9 | 6.7 | 6.7 |
| Dry Coating Weight | 0.420 | 0.460 | 0.420 | 0.720 | 0.750 | 0.760 |
| Sensitivity 1 | 130 | 130 | 120 | 120 | 120 | 120 |
| Sensitivity 2 | 190 | 183 | 190 | 145 | 134 | 129 |
| Clean out | 1 | 1 | 1 | 1 | 1 | 1 |

From the results shown in Table 4, it can be concluded:

When the average particle diameter of the hydrophobic particles is less than 40 nm and the amount of IR-dye (mg), without taking into account the counter ion, per $m^2$ of total surface of the particles is less than 0.80 $mg/m^2$, a bad clean out is observed (Comparative Examples 10 to 12).

When the average particle diameter of the hydrophobic particles is less than 40 nm and the amount of IR-dye (mg), without taking into account the counter ion, per $m^2$ of total surface of the particles is more than 0.80 $mg/m^2$, a good clean out is observed (all Inventive Examples).

When the average particle diameter of the hydrophobic particles is less than 40 nm and the amount of IR-dye (mg), without taking into account the counter ion, per $m^2$ of total surface of the particles is more than 0.80 $mg/m^2$, a higher sensitivity is obtained compared to hydrophobic particles with an average particle size of more than 40 nm (Comparative Examples 1-3, 17 and all Inventive Examples).

A high sensitivity is obtained when the amount of hydrophobic thermoplastic polymer particles relative to the total weight of the ingredients of the imaging layer is at least 60 wt. % (Comparative Examples 20 to 22 and all Inventive Examples).

Example 2

Printing Plate Precursors PPP-31 to 42

Preparation of the Printing Plate Precursors PPP-31 to PPP-42

The preparation of the printing plate precursors was performed as described in Example 1. Table 5 lists the resulting dry coating weight of the different components on the printing plate precursors.

TABLE 5

| Dry Coating Weight ($g/m^2$) of Ingredients of PPP-31 to PPP-42 | | | | | | |
|---|---|---|---|---|---|---|
| | PPP | | | | | |
| | PPP-31 (COMP) | PPP-32 (COMP) | PPP-33 (COMP) | PPP-34 (INV) | PPP-35 (INV) | PPP-36 (INV) |
| LX-01 | 0.532 | — | — | — | — | — |
| LX-04 | — | 0.436 | — | — | — | — |
| LX-02 | — | — | 0.386 | 0.593 | 0.593 | 0.593 |
| IR-1 | — | — | — | — | — | — |
| IR-2 | 0.069 | 0.042 | 0.042 | — | — | — |
| IR-3 | — | — | — | 0.108 | 0.108 | 0.108 |
| IR-4 | — | — | — | — | — | — |
| PAA | 0.069 | 0.037 | 0.030 | 0.081 | 0.061 | 0.081 |
| HEDP | 0.049 | 0.034 | 0.034 | 0.018 | 0.018 | 0.018 |
| CD-01 | 0.024 | — | — | 0.030 | 0.030 | — |
| CD-02 | — | 0.029 | 0.029 | — | — | 0.035 |
| CD-03 | — | 0.018 | 0.018 | — | — | 0.022 |
| FSO 100 | 0.008 | 0.008 | 0.008 | 0.006 | 0.006 | 0.006 |
| Sum ingredients | 0.600 | 0.480 | 0.600 | 0.840 | 0.820 | 0.860 |

TABLE 5-continued

| Dry Coating Weight (g/m²) of Ingredients of PPP-31 to PPP-42 | PPP | | | | | |
|---|---|---|---|---|---|---|
| | PPP-37 (COMP) | PPP-38 (COMP) | PPP-39 (INV) | PPP-40 (COMP) | PPP-41 (INV) | PPP-42 (COMP) |
| LX-02 | 0.593 | 0.593 | 0.617 | 0.617 | 0.594 | 0.594 |
| IR-1 | — | — | 0.113 | 0.085 | — | — |
| IR-2 | 0.081 | — | — | — | — | — |
| IR-3 | — | 0.081 | — | — | — | — |
| IR-4 | — | — | — | — | 0.108 | 0.065 |
| PAA | 0.061 | 0.061 | 0.065 | 0.065 | 0.061 | 0.061 |
| HEDP | 0.018 | 0.018 | 0.019 | 0.019 | 0.03 | 0.03 |
| CD-01 | — | — | 0.031 | 0.031 | — | — |
| CD-02 | 0.035 | 0.035 | — | — | 0.035 | 0.035 |
| CD-03 | 0.022 | 0.022 | — | — | 0.022 | 0.022 |
| FSO 100 | 0.006 | 0.006 | 0.006 | 0.006 | 0.006 | 0.006 |
| Sum ingredients | 0.820 | 0.820 | 0.850 | 0.820 | 0.860 | 0.810 |

Exposure, Development and Printing of the Printing Plate Precursors

The printing plate precursors were exposed as described in Example 1. After exposure, the printing plate precursors were developed in a Clean Out Unit (COU 80, trademark), operating at a speed of 1.1 m/min. at 22° C. using a gum solution prepared as follows:

To 700 ml demineralized water:

77.3 ml Dowfax 3B2 (commercially available from Dow Chemical), 32.6 g of trisodium citrate dihydrate, and 9.8 g citric acid monohydrate, were added whiles stirring, and demineralized water was further added to obtain 1000 g gum solution.

After development, the printing plates were mounted on the press and printing started as described in Example 1.

Evaluation of the Printing Plate Precursors PPP-31 to PPP-42

The printing plate precursors are evaluated by the following characteristics:

Sensitivity 1: See example 1

Sensitivity 3: Plate sensitivity (B-25 2%) (mJ/cm²): is the interpolated energy density value where the surface coverage (calculated from the measured optical density of the thousandth print on paper) of a B-25 2% dot patch equals 55%. A B-25 2% dot patch consists of 2% ABS (200 lpi, 2400 dpi) dots, but the total surface coverage of these dots is 25%. ABS dots are generated with the Agfa Balanced Screening methodology.

Clean-out: After 750 prints, the paper sheet size is shortened and printing is continued for another 250 prints. After 1,000 prints, a few more prints are generated on the normal paper size. If any staining should occur, this will result in an accumulation of ink on the blanket, while printing is performed with the shortened paper size. This accumulated ink will then be transferred to the paper when the normal paper size is used again, after 1,000 prints. This method allows for a very precise evaluation of the stain level. A value of 5.0 indicates that no stain is observed after 1,000 prints. A value of 4.0 would be barely acceptable. A value of 3.0 would be totally unacceptable for high quality print jobs.

The optical densities referred to above are all measured with a Gretag Macbeth densitometer Type D19C.

In Table 6, the lithographic properties of the printing plate precursors PPP-31 to PPP-42 are shown, together with the relevant parameters of the printing plate precursors relating to the preferred embodiments of the present invention (see Example 1).

TABLE 6

| Lithographic Evaluation of PPP-31 to PPP-42 | PPP | | | | | |
|---|---|---|---|---|---|---|
| | PPP-31 (COMP) | PPP-32 (COMP) | PPP-33 (COMP) | PPP-34 (INV) | PPP-35 (INV) | PPP-36 (INV) |
| $Ø_{PCS}$ (nm) | 59 | 45 | 37 | 37 | 37 | 37 |
| $Ø_V$ (nm) | 53 | 41 | 34 | 34 | 34 | 34 |
| Surface (m²/g) | 98 | 132 | 160 | 160 | 160 | 160 |
| IR-dye/Surf. (mg/m²) | 1.17 | 0.65 | 0.60 | 1.00 | 1.00 | 1.00 |
| Latex wt. % | 70.75 | 72.20 | 70.53 | 70.89 | 72.65 | 68.69 |
| Latex/binder | 7.7 | 11.8 | 12.7 | 7.3 | 9.8 | 7.3 |
| Dry Coating Weight | 0.600 | 0.480 | 0.600 | 0.840 | 0.820 | 0.860 |
| Sensitivity 1 | >240 | 210 | 180 | 180 | 150 | 180 |
| Sensitivity 3 | >220 | 220 | 160 | 165 | 175 | 195 |
| Clean out | 5.0 | 4.0 | 3.5 | 5.0 | 4.5 | 4.5 |

TABLE 6-continued

| Lithographic Evaluation of PPP-31 to PPP-42 | | | | | | |
|---|---|---|---|---|---|---|
| | PPP | | | | | |
| | PPP-37 (COMP) | PPP-38 (COMP) | PPP-39 (INV) | PPP-40 (COMP) | PPP-41 (INV) | PPP-42 (COMP) |
| $Ø_{PCS}$ (nm) | 37 | 37 | 37 | 37 | 37 | 37 |
| $Ø_V$ (nm) | 34 | 34 | 34 | 34 | 34 | 34 |
| Surface ($m^2$/g) | 160 | 160 | 160 | 160 | 160 | 160 |
| IR-dye/Surf. (mg/$m^2$) | 0.76 | 0.75 | 1.09 | 0.79 | 1.10 | 0.66 |
| Latex wt. % | 72.67 | 72.67 | 72.54 | 75.02 | 69.38 | 73.08 |
| Latex/binder | 9.8 | 9.8 | 9.5 | 9.5 | 9.8 | 9.8 |
| Dry Coating Weight | 0.820 | 0.820 | 0.850 | 0.820 | 0.860 | 0.810 |
| Sensitivity 1 | 180 | 180 | 120 | 120 | 150 | 120 |
| Sensitivity 3 | 180 | 140 | 170 | 115 | 160 | 130 |
| Clean out | 3.5 | 3.5 | 4.5 | 3.0 | 5.0 | 3.5 |

From the results shown in Table 6, it can be concluded:

When the average particle diameter of the hydrophobic particles is less than 40 nm and the amount of IR-dye (mg), without taking into account the counter ion, per $m^2$ of total surface of the particles is less than 0.80 mg/$m^2$, a bad clean out is observed (Comparative Examples 33, 37, 38, 40 and 42).

When the average particle diameter of the hydrophobic particles is less than 40 nm and the amount of IR-dye (mg), without taking into account the counter ion, per $m^2$ of total surface of the particles is more than 0.80 mg/$m^2$, a good clean out is observed (all Inventive Examples).

When the average particle diameter of the hydrophobic particles is less than 40 nm and the amount of IR-dye (mg), without taking into account the counter ion, per $m^2$ of total surface of the particles is more than 0.80 mg/$m^2$, a higher sensitivity is obtained compared to hydrophobic particles with an average particle size of more than 40 nm (Comparative Examples 31 and 32 and all Inventive Examples).

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A heat-sensitive negative-working lithographic printing plate precursor comprising:

a support having a hydrophilic surface or which is provided with a hydrophilic layer, and a coating provided thereon, the coating including an image-recording layer which includes hydrophobic thermoplastic polymer particles, a binder, and an infrared absorbing dye; wherein the amount of the infrared absorbing dye, without taking into account an optional counter ion, is more than 0.80 mg per $m^2$ of a total surface of the thermoplastic polymer particles, measured by Hydrodynamic Fractionation;

the amount of hydrophobic thermoplastic polymer particles relative to a total weight of all ingredients of the imaging layer is at least 60%; and the hydrophobic thermoplastic polymer particles have an average particle diameter, measured by Photon Correlation Spectroscopy, of more than 20 nm and less than 36 nm.

2. The heat-sensitive negative-working lithographic printing plate precursor according to claim 1, wherein the amount of the infrared absorbing dye, without taking into account an optional counter ion, is more than 1.00 mg per $m^2$ of the total surface of the thermoplastic polymer particles.

3. A heat-sensitive negative-working lithographic printing plate precursor comprising:

a support having a hydrophilic surface or which is provided with a hydrophilic layer, and a coating provided thereon, the coating including an image-recording layer which includes hydrophobic thermoplastic polymer particles, a binder, and an infrared absorbing dye; wherein the hydrophobic thermoplastic polymer particles have an average particle diameter, measured by Photon Correlation Spectroscopy, of more than 10 nm and less than 40 nm;

the amount of hydrophobic thermoplastic polymer particles relative to a total weight of all ingredients of the imaging layer is at least 60%; and the amount of the infrared absorbing dye, without taking into account an optional counter ion, is more than 1.00 mg per $m^2$ of a total surface of the thermoplastic polymer particles, measured by Hydrodynamic Fractionation.

4. The heat-sensitive negative-working lithographic printing plate precursor according to claim 3, wherein the amount of the hydrophobic thermoplastic polymer particles relative to the total amount of all ingredients of the image-recording layer is at least 70%.

5. The heat-sensitive negative-working lithographic printing plate precursor according to claim 3, wherein the amount of the hydrophobic thermoplastic polymer particles relative to the amount of the binder is at least 4:1.

6. The heat-sensitive negative-working lithographic printing plate precursor according to claim 4, wherein the amount of the hydrophobic thermoplastic polymer particles relative to the amount of the binder is at least 4:1.

7. The heat-sensitive negative-working lithographic printing plate precursor according to claim 3, wherein the image-recording layer further includes an organic compound including at least one phosphonic acid group or at least one phosphoric acid group, or a salt thereof.

8. The heat-sensitive negative-working lithographic printing plate precursor according to claim 4, wherein the image-recording layer further includes an organic compound including at least one phosphonic acid group or at least one phosphoric acid group, or a salt thereof.

9. The heat-sensitive negative-working lithographic printing plate precursor according to claim 6, wherein the image-recording layer further includes an organic compound including at least one phosphonic acid group or at least one phosphoric acid group, or a salt thereof.

10. A heat-sensitive negative-working lithographic printing plate precursor comprising:

a support having a hydrophilic surface or which is provided with a hydrophilic layer, and a coating provided thereon, the coating including an image-recording layer which includes hydrophobic thermoplastic polymer particles, a binder, and an infrared absorbing dye; wherein the hydrophobic thermoplastic polymer particles have an average particle diameter, measured by Photon Correlation Spectroscopy, of more than 10 nm and less than 40 nm;

the amount of the infrared absorbing dye, without taking into account an optional counter ion, is more than 0.80 mg per $m^2$ of a total surface of the thermoplastic polymer particles, measured by Hydrodynamic Fractionation;

the amount of hydrophobic thermoplastic polymer particles relative to a total weight of all ingredients of the imaging layer is at least 60%; and the image-recording layer further includes an organic compound including at least one phosphonic acid group or at least one phosphoric acid group, or a salt thereof.

11. A method for making a lithographic printing plate comprising the steps of:

providing a heat-sensitive negative-working lithographic printing plate precursor including:

a support having a hydrophilic surface or which is provided with a hydrophilic layer, and a coating provided thereon, the coating including an image-recording layer which includes hydrophobic thermoplastic polymer particles, a binder, and an infrared absorbing dye; wherein the hydrophobic thermoplastic polymer particles have an average particle diameter, measured by Photon Correlation Spectroscopy, of more than 10 nm and less than 40 nm;

the amount of the infrared absorbing dye, without taking into account an optional counter ion, is more than 0.80 mg per $m^2$ of a total surface of the thermoplastic polymer particles, measured by Hydrodynamic Fractionation; and the amount of hydrophobic thermoplastic polymer particles relative to a total weight of all ingredients of the imaging layer is at least 60% exposing the printing plate precursor to heat or infrared light;

mounting the exposed printing plate precursor on a printing press; and developing the printing plate precursor by supplying ink and/or fountain solution to the printing plate precursor thereby removing unexposed areas of the image recording layer.

12. The method according to claim 11, wherein the infrared light used to expose the printing plate precursor has an energy density, measured on the surface of the precursor, of 200 $mJ/cm^2$ or less.

13. The method according to claim 12, further comprising the steps of:

supplying ink and fountain solution to the printing plate mounted on a printing press; and transferring the ink to paper.

* * * * *